(12) United States Patent
Olsson

(10) Patent No.: US 7,144,539 B2
(45) Date of Patent: Dec. 5, 2006

(54) IMPRINT METHOD AND DEVICE

(75) Inventor: Lennart Olsson, Malmö (SE)

(73) Assignee: Obducat AB, Malmö (SE)

( * ) Notice: Subject to any disclaimer, the term of this patent is extended or adjusted under 35 U.S.C. 154(b) by 504 days.

(21) Appl. No.: 10/115,071

(22) Filed: Apr. 4, 2002

(65) Prior Publication Data
US 2003/0189273 A1 Oct. 9, 2003

(51) Int. Cl.
*B29C 59/00* (2006.01)
*B29C 43/02* (2006.01)
*H01L 21/302* (2006.01)

(52) U.S. Cl. .................. 264/293; 264/314; 425/385

(58) Field of Classification Search ............... 264/293, 264/314; 425/385
See application file for complete search history.

(56) References Cited

U.S. PATENT DOCUMENTS

| | | | |
|---|---|---|---|
| 4,233,261 A * | 11/1980 | Mijnheer | 264/293 |
| 5,078,947 A * | 1/1992 | Nishizawa et al. | 264/1.1 |
| 5,507,996 A | 4/1996 | Brouard | |
| 5,670,228 A | 9/1997 | Kakamu | |
| 5,772,905 A | 6/1998 | Chou | |
| 5,947,027 A | 9/1999 | Burgin et al. | |
| 5,956,216 A | 9/1999 | Chou | |
| 6,019,587 A | 2/2000 | Takahashi | |
| 6,030,576 A | 2/2000 | Cassani | |
| 6,482,742 B1 | 11/2002 | Chou | |
| 2002/0132482 A1 | 9/2002 | Chou | |
| 2004/0131718 A1* | 7/2004 | Chou et al. | 425/385 |
| 2004/0219249 A1 | 11/2004 | Chung et al. | |

FOREIGN PATENT DOCUMENTS

| | | |
|---|---|---|
| WO | WO 01/42858 | 6/2001 |
| WO | WO 02/07199 | 1/2002 |

OTHER PUBLICATIONS

Office Action dated Dec. 29, 2004 in Co-pending U.S. Appl. No. 10/149,072, Nov. 26, 2002, "Device and Method in Connection with the Production of Structures.".
International Search Report, Mar. 22, 2001, filed in PCT/SE00/02417, published as WO 01/42858, a priority document for Co-pending U.S. Appl. No. 10/149,072, Nov. 26, 2002, "Device and Method in Connection with the Production of Structures.".
Sukeaki, M., Method and Device for Sticking Disks Together, abstract for JP-H01-241046, Sep. 26, 1989.

* cited by examiner

*Primary Examiner*—Stefan Staicovici
(74) *Attorney, Agent, or Firm*—Finnegan, Henderson, Farabow, Garrett & Dunner, L.L.P.

(57) ABSTRACT

An imprint process comprises the step of aligning a substrate, supported on a first support member, with a template, supported on a second support member. The substrate has at least one essentially plane surface provided with a moldable film. The template has at least one essentially plane surface provided with a relief pattern. The relief pattern is adapted to interact with the moldable film. The process further comprises the step of arranging a sealing gasket between the template and the second support member, such that a pressure cavity is defined by the second support member, the template and the sealing gasket. The process also comprises the step of applying a static gas pressure to the pressure cavity, in order to provide a pressure between the template and the substrate. The pressure is sufficient to form a pattern in the moldable film. An imprint device is also disclosed.

50 Claims, 7 Drawing Sheets

IMPRINT METHOD AND DEVICE

TECHNICAL FIELD

The present invention relates to an imprint process and device. More specifically, the present invention relates to a process and a device which is suitable for nanoimprint lithography and embossing.

PRIOR ART

In many contexts it is desirable to provide small structures in the surface of a material. A method for providing such small structures is nanoimprint lithography. Known methods and devices for nanoimprint lithography are described in U.S. Pat. No. 5,772,905 and WO01/42858A1, which are hereby incorporated by reference. Another known method is disclosed in WO02/07199A1.

Nanoimprint lithography typically utilizes a printing process, wherein a relief pattern is formed in the surface of a template and transferred onto a moldable film which is arranged on a substrate. The moldable film is subjected to e.g. removal of reduced thickness portions, which exposes the underlying part of the substrate for further processing. The process of transferring the relief pattern usually includes pressing the template against the surface of the substrate such that a mirror image of the relief pattern is created in the surface of the substrate.

Typically, the substrate and the template are attached to a respective support member, and the support members are pressed together, thus pressing together the template and the substrate as well. A problem that is common for all nanoimprint lithography processes is that the pressure, i.e. the force across the respective surfaces need to be uniform, so that the relief pattern is uniformly transferred to the substrate. This problem is often referred to as one of parallelization.

U.S. Pat. No. 5,772,905 discloses some fundamental principles of nanoimprint lithography, but does not discuss the problem of parallelization, nor does it disclose any practical embodiments of a printing apparatus.

WO01/42858A1 discloses a method for nanoimprint lithography, where the parallelization problem is solved by providing a pressure cavity in one of the support members. The template or the substrate supported on the support member is arranged on a surface of a membrane, whose other surface is in communication with the pressure cavity. When transferring the relief pattern, the two support members are pressed together so as to align the template and the substrate. When the template and the substrate are aligned, the pressure in the pressure cavity is increased, thus pressing the template or the substrate supported on the membrane surface against its counterpart, i.e. the corresponding substrate or template, respectively. The medium providing the pressure in the pressure cavity may be incompressible, e.g. a hydraulic oil.

A disadvantage with a device using hydraulic oil is, however, that it is difficult to make it compatible with clean rooms, in which imprinting machines are frequently to be placed.

FIG. 7 of WO02/07199A1 discloses two fundamentally different types of nanoimprint lithography devices.

According to the first type, the substrate and the template are arranged such that there is an enclosed space between them. for example, a sealing gasket may be arranged around their perimeter in order to effectively enclose that space. The substrate-template aggregate is placed in a pressure chamber, which is pressurized by e.g. a gas, whereby the template and the substrate are pressed together. This first type of nanoimprint lithography device has drawbacks from a productivity point-of-view: insertion and removal of the aggregate in the pressure chamber is time consuming; the time it takes to fill up the pressure chamber will limit the cycle time; and the consumption of pressure medium is high.

In the second type, the back surface of the template is in direct communication with a pressure cavity, without any membrane being present. The pressure against the template is created by compressed gas being pressed through an apertured plate, thus forming a set of jets which uniformly press the template against the substrate. In WO02/07199A1, it is also suggested that an O-ring is placed between the support member supporting the template and the template itself, so that the gas outflow from the pressure cavity is decreased and thus the pressure inside it is increased.

When gas is used as a pressure medium and a leak arises due to e.g. a template breaking, the compressed gas housed in the pressure cavity may rapidly expand and may sometimes cause an explosion-like condition, which may damage adjacent equipment or, at worst, personnel working near the lithography device.

A specific drawback of the device suggested in WO02/07199A1 is that the outflow of gas from the pressure cavity may negatively affect the surrounding environment. Furthermore, the dynamic pressure created by the use of jets for providing the pressure against the back surface of the template jeopardizes the evenness of the template, since each jet will necessarily create a pressure maximum. In order to compensate for these pressure maximums, it is necessary to provide a large enough distance between the apertured plate and the back surface of the template, so that the pressure from the jets will be able to even out. consequently, the volume of the pressure cavity will be large, thus increasing the consumption of pressure medium, i.e. gas, the time required to fill up the cavity so as to reach the desired pressure, and the risk of explosion.

The present nanoimprinting devices suffer from risks of explosion-like outflow of pressure medium, low throughput and non-uniform pressure. It is generally desirable to increase the productivity of nanoimprinting methods and devices. It is also desirable to decrease the risk or effects of rapid expansions of leaking pressure medium. It is also desirable to provide a device and method being compatible with clean area environments.

SUMMARY OF THE INVENTION

It is thus an object of the present invention to provide a method and a device, which eliminate the disadvantages with the prior art methods and devices.

The above object is achieved wholly or partially by a method and a device as set forth in the enclosed claims and in the following description.

Thus, according to a first aspect of the invention, an imprint process is provided. The process comprises the step of aligning a substrate, supported on a first support member, with a template, supported on a second support member. The substrate has at least one essentially plane surface provided with a moldable film. The template has at least one essentially plane surface provided with a relief pattern, which faces the moldable film. The process further comprises the step of arranging a sealing gasket between the template and the second support member, such that a pressure cavity is defined by said second support member, said template and said sealing gasket. The process also comprises the step of applying a static gas pressure to said pressure cavity, in order to provide a pressure between said template and said substrate, so as to form a pattern in said moldable film.

It is realized that the substrate and the template may be shifted, so that the substrate is arranged at the pressure cavity instead of the template. Also, both the substrate and the template may be arranged at a support member having a pressure cavity.

By providing a static pressure, the pressure on the template or substrate back surface will be uniform, thus ensuring that the template and the substrate are parallel and that there are no local pressure maximums.

Using a gas instead of e.g. hydraulic oil, preferably an inert gas, reduces the risk of contaminating the environment surrounding the machine. This is especially advantageous when using the device in e.g. a clean area environment.

By minimizing the pressure cavity, the use of pressure medium is reduced, thus decreasing the risk of contaminating the surrounding environment in case of a leakage or in connection with the replacement of substrates and/or templates. Also, the reduction of the pressure cavity decreases the effects of rapid expansions or explosions of pressure medium in case e.g. a template or substrate should break, since the amount of pressure medium that is available for flowing out is small.

Also, the reduced use of pressure medium may lead to savings in the consumption of pressure medium, thus reducing production cost. The reduction of the pressure cavity also enables a shorter time for filling and emptying the cavity, thus reducing the production cycle time.

Providing the pressure directly to the back surface of the template or the substrate effectively eliminates the need for the membrane.

The substrate and the template are essentially plane, i.e. they are plane, although their respective surfaces may have relief patterns. This applies both to the template, which by definition has a relief pattern and to the substrate since it may have been subjected to prior processing and thus does not have an entirely smooth surface at the beginning of processing. The thickness of the template or substrate may also vary over its area.

Alternatively, the step of aligning said substrate and said template may comprise aligning said template with a recess in a surface of said second support member, said recess being adapted for providing said static fluid pressure on said back surface of said template. The recess allows for controlling the exact volume and shape of the pressure cavity. A slightly larger volume may in some cases be desirable, in order to optimize the process of filling and emptying the cavity.

The static fluid pressure may be maintained by a contact pressure in the contact surface between said sealing gasket and said template, said contact pressure being achieved by pressing together said second support member and said first support member.

The process may further comprise the step of arranging a second sealing gasket between said template and said second support member, said second sealing gasket thus encircling a second surface area of the second support member. Thus, substrates or templates having a through hole may be processed.

The process may further comprise the step of applying an at least partial vacuum to said pressure cavity, said at least partial vacuum being sufficient to retain said template when the second support member is spaced apart from said first support member, and the device thus is deactivated. When applying the vacuum, said second support member and said template remain spaced apart throughout the step of applying said at least partial vacuum to said pressure cavity.

The steps of the method may be performed in different order.

According to a second aspect of the invention, an imprint process is provided, comprising the steps of aligning a substrate, with a first and a second templates, said substrate having first and second essentially plane surfaces, each surface being provided with a respective moldable film, said first and second templates each having at least one essentially plane surface, which is provided with a respective relief pattern, each relief pattern facing one of said moldable films; said first and second templates being supported on first and second support members, respectively; arranging a respective sealing gasket between each of said first and second templates and said respective support member, such that a first and a second pressure cavity is defined by said respective support member, said respective template and said respective sealing gasket; and applying a static gas pressure to said first and second pressure cavities, in order to provide a pressure between said templates and said substrate, in order to form patterns in said first and second moldable films.

The imprint process according to the second aspect provides the opportunity of imprinting a double sided substrate in a single step. The function and features of the imprint process according to the first aspect of the invention apply to the imprint process according to the second aspect as well.

According to a third aspect of the invention, an imprint device is provided. The imprint device comprises a first support member for receiving an essentially plane substrate, and a second support member arranged for receiving a first sealing gasket and an essentially plane template. A surface area of said second support member, facing the first support member, said first sealing gasket encircling said surface area and the template define a pressure cavity. The device is arranged to press said first and second support members towards each other and to provide a static gas pressure within said pressure cavity.

The device is adapted for carrying out the process described above.

The static gas pressure may be arranged to assume at least two states. In a first state, the static gas pressure within said pressure cavity is essentially equal to or less than a gas pressure of a surrounding environment. In a second state, the static gas pressure within the pressure cavity is substantially higher than in the first state. In the first state, an average distance between a back surface of the template and the surface area of the second support member may be between 0.01 and 4 millimeters, preferably between 0.3 and 1 millimeters and more preferably between 0.4 and 0.6 millimeters. According to one embodiment, the surface area may provided with a recess extending over at least a part of the surface area.

The device may further comprise a second sealing gasket encircling a second surface area of the support member, in order to enable processing of substrates and/or templates having one or more through holes. Thus, the pressure cavity may defined by the first surface area of said second support member, the first sealing gasket encircling said first surface area, the second sealing gasket encircling the second surface area, and said template. In one embodiment, the pressure cavity is defined by a surface area that is located outside said second sealing gasket and inside said first sealing gasket. This may be the case when said second sealing gasket is arranged concentrically with said first sealing gasket, which may be the case when e.g. imprinting a CD or a DVD.

It is realized that the sealing gasket may have any suitable shape and cross section.

The device may also be arranged to provide an at least partial vacuum to the pressure cavity. The at least partial vacuum may be sufficient to retain said template when the template and the substrate are spaced apart. This provides a way of retaining the template to the support member when the support members are parted, so as to enable e.g. a change of substrates. It is realized that the substrate and template may be arranged in different orientations, e.g. horizontally, vertically or other angle, as long as they are parallel when in contact with each other. The term "vacuum" should be understood to include any pressure which is lower than the pressure of the environment surrounding the pressure chamber. The at least partial vacuum may be low enough for said support member and said template to remain spaced apart while said at least partial vacuum is applied to said pressure cavity. This means that the vacuum should not be so strong as to deflect the template or the sealing gasket so much as to cause the template to come into contact with the support member.

It is realized that, in the device described, the template and the substrate may be shifted, so that the substrate is arranged at the pressure cavity. Also, both support members may have a pressure cavity.

According to a fourth aspect of the invention, an imprint device is provided. The imprint device comprises a first support member for receiving a first sealing gasket and a first essentially plane template, a second support member for receiving a second sealing gasket and a second essentially plane template. A first surface area of said first support member, facing the second support member, the first sealing gasket encircling the first surface area and the first template define a first pressure cavity. A second surface area of said second support member, facing the first support member, the second sealing gasket encircling the second surface area and the second template define a second pressure cavity. The device is arranged to press said first and second support members towards each other and to provide a static gas pressure within said first and second pressure cavities.

The device according to the fourth aspect provides a means for carrying out the process of the second aspect of the invention. The function and features of the imprint device according the third aspect of the invention apply to the imprint device according to fourth aspect as well.

The different features described above may, of course be combined in the same embodiment.

BRIEF DESCRIPTION OF THE DRAWINGS

The invention will be described in more detail with reference to the appended schematic drawings, which show examples of presently contemplated embodiments of the invention.

DETAILED DESCRIPTION OF EMBODIMENTS OF THE INVENTION

Figure 1:
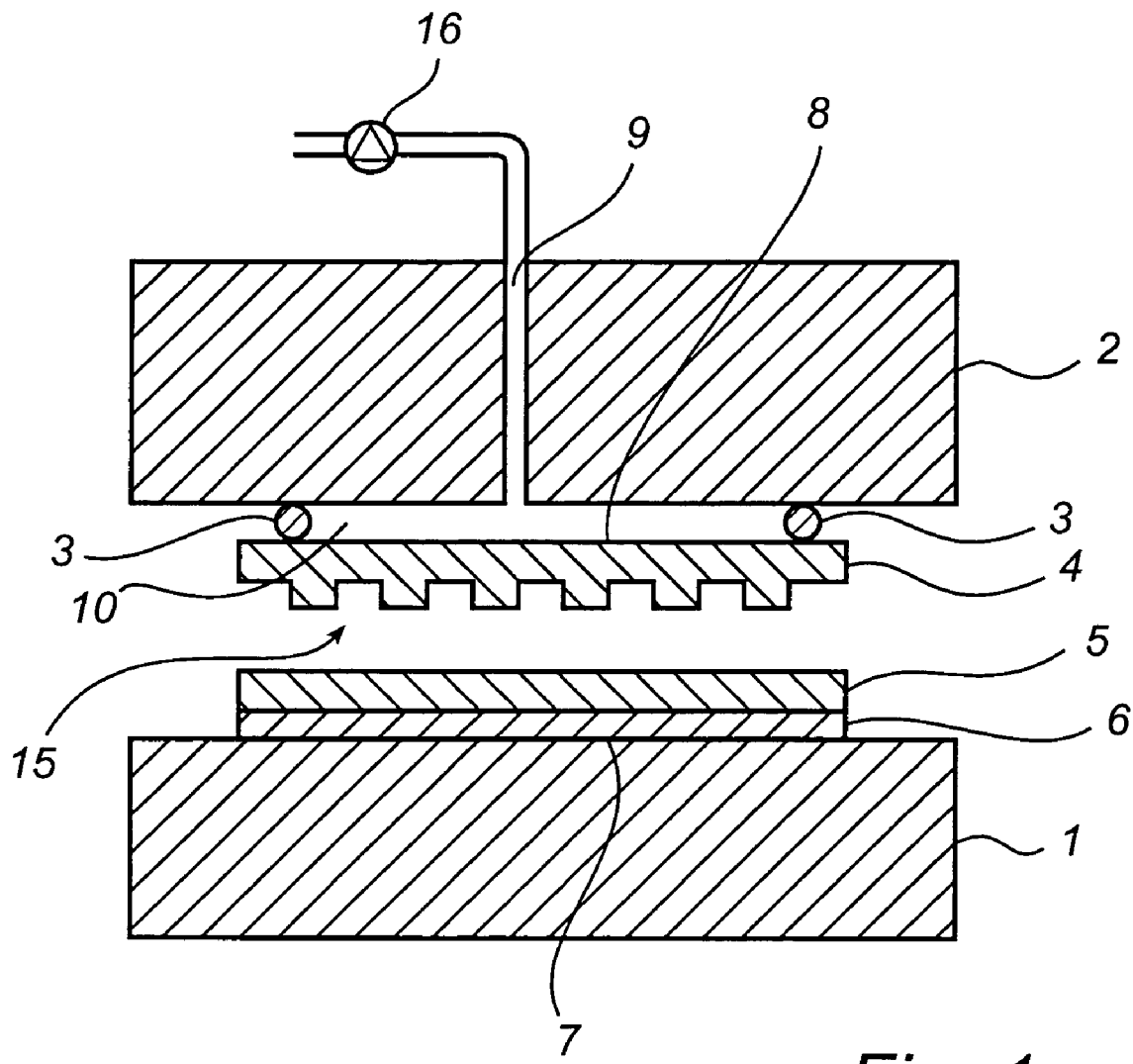
FIG. 1 is a schematic cross sectional view of a first embodiment of the invention.

FIG. 1 is a schematic cross sectional view of a first embodiment of the invention. In FIG. 1, a first support member 1, and a second support member 2 are arranged to support a substrate 6 and a template 4, respectively. The substrate 6 and the template 4 may be sheet-like structures, i.e. having two major surfaces and a relatively thin cross section. At least one of the major surfaces is the active surface, i.e. the surface having the relief pattern in the case of the template and the surface having the moldable film, in the case of the substrate. The thickness of the template and the substrate may be constant, but it may also vary, as long as the active surfaces remain essentially plane.

The support members 1, 2 may be movable relative each other in order to enable the insertion and removal of the substrate 6 and the template 4. In the embodiment shown in the enclosed drawings, the substrate is arranged horizontally on a lower support member 1, while the template is arranged horizontally on an upper support member. The support members 1, 2 may be movable e.g. in a direction perpendicular to the surface of the substrate 6, e.g. vertically as shown in the drawings. However, it is also possible to arrange the template and substrate in other orientations, such as vertically or at some suitable angle.

The substrate 6 supported on the first support member 1 is typically provided with a moldable surface, such as a film 5. The film may be of any material which is moldable such that an imprint from a template may be permanently retained, e.g. PMMA or any other known resist. The molding may require treatment by heating, cooling, radiation or any chemical treatment in order for the molding to become permanent. The support member 1 may be provided with equipment (not shown) for performing this treatment, such as e.g. a heater, cooler, radiating equipment or supply of chemicals in any form, e.g. gas or liquid.

The template 4 supported on the second support member 2 typically has a relief pattern 15 which is fabricated using any suitable method such as electron beam lithography, reactive ion etching or other methods.

The template 4 is supported on the second support member 2 by a sealing gasket 3, which essentially extends around the area of the relief pattern. The sealing gasket 3 may be housed in a groove (not shown) in the second support member 2 and be attached thereto in any suitable fashion. The sealing gasket 3 may also be arranged in a corresponding groove in the template 4. The surface of the support member 2, the sealing gasket 3 and the back surface 8 of the template together define a cavity 10, which will function as a pressure cavity for providing a pressure on the back surface of the template 4.

The pressure in the pressure cavity 10 is controlled via a pressure medium channel 9, which in turn is connected to an appropriate pressure control apparatus (not shown). The pressure medium channel 9 may be provided with a valve 16 for controlling the flow in the pressure medium channel. The valve 16 may be adapted for limiting the flow in the pressure medium channel, so as to prevent major outflows of pressure medium in case e.g. the template 4 or the substrate 6 should break.

It is also possible to provide the pressure cavity 10 and/or the pressure medium channel 9 with a pressure sensor. Such a pressure sensor may provide an accurate measurement of the pressure inside the cavity. The measurement may be used to control the pressure in order to prevent damage to the substrate and/or the template. It is also possible to monitor the pressure in the cavity 10 with a view to cutting of the flow of pressure medium in the pressure medium channel 9 in case of a rapid decline in pressure, such as would be the case when a template or a substrate breaks.

In order to generate a sufficient contact pressure between the sealing gasket, the template and the support member, a pressure may be added on the support members after the template and the substrate have been aligned.

Figure 2:
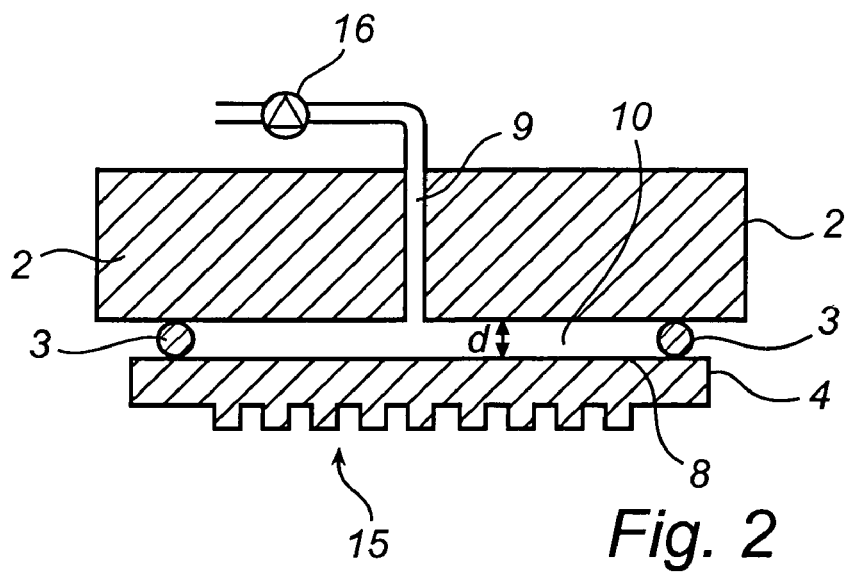
FIG. 2 is a schematic cross sectional view of the second support member 2.

FIG. 2 is a schematic cross sectional view of the second support member 2. In FIG. 2, the distance between the template back surface and the surface of the second support member 2 is denoted with reference numeral d. It is realized that the distance d may vary within the pressure cavity and between different operating states.

As stated above, it is desirable to provide as small a cavity as possible. A typical measure of the height of the cavity may be between 0.01 and 4 millimeters and possibly between 0.3 and 1 millimeters. In one embodiment, the distance d may be between 0.4 and 0.6 millimeters.

Figure 3:
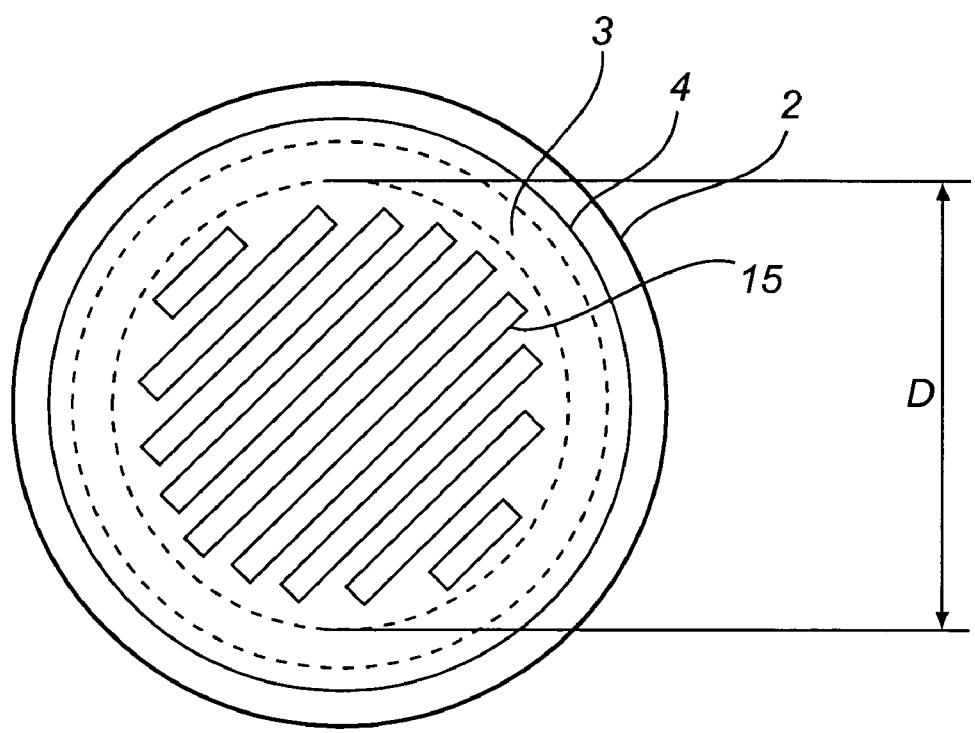
FIG. 3 is a schematic top view of the second support member 2.

FIG. 3 is a schematic cross sectional view of the second support member 2. In FIG. 3, the area of the template which is encircled by the sealing gasket is denoted with reference numeral D.

The volume contained in the pressure cavity is defined as V. For illustration purposes, the volume V may be defined by the area encircled by the sealing gasket and the distance d.

According to the invention, it is desirable to minimize the volume V, since this volume is to be filled with pressure medium so as to create the pressure for transferring the relief pattern onto the substrate's moldable film 5.

Figure 4:
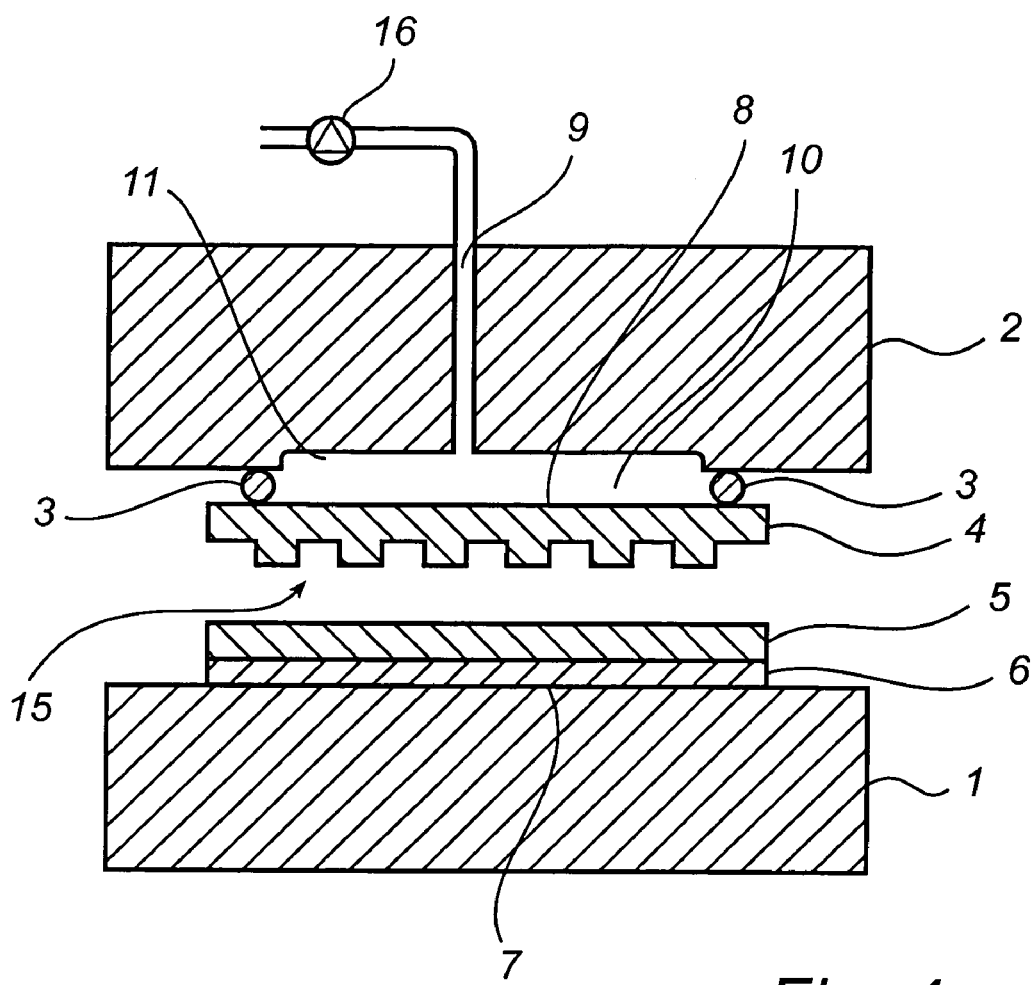
FIG. 4 is a schematic cross sectional of a second embodiment of the invention.

FIG. 4 is a schematic cross sectional of a second embodiment of the invention The embodiment of FIG. 2 essentially corresponds to the embodiment shown in FIG. 1, except for the addition of a recess 11 in the surface of the support member 2. The recess functions so as to increase the distance d between the surface of the support member 2 and the template back surface 8, Thus, the pressure cavity is defined by the template back surface 6, the sealing gasket 3 and the recess. It is realized that the recess does not need to have a uniform depth, but may have any suitable shape. Also, the recess may cover a surface area that is equal to the area provided with the relief pattern, or a smaller area. It may be provided with e.g. grooves for controlling airflows within the cavity.

Figure 5:
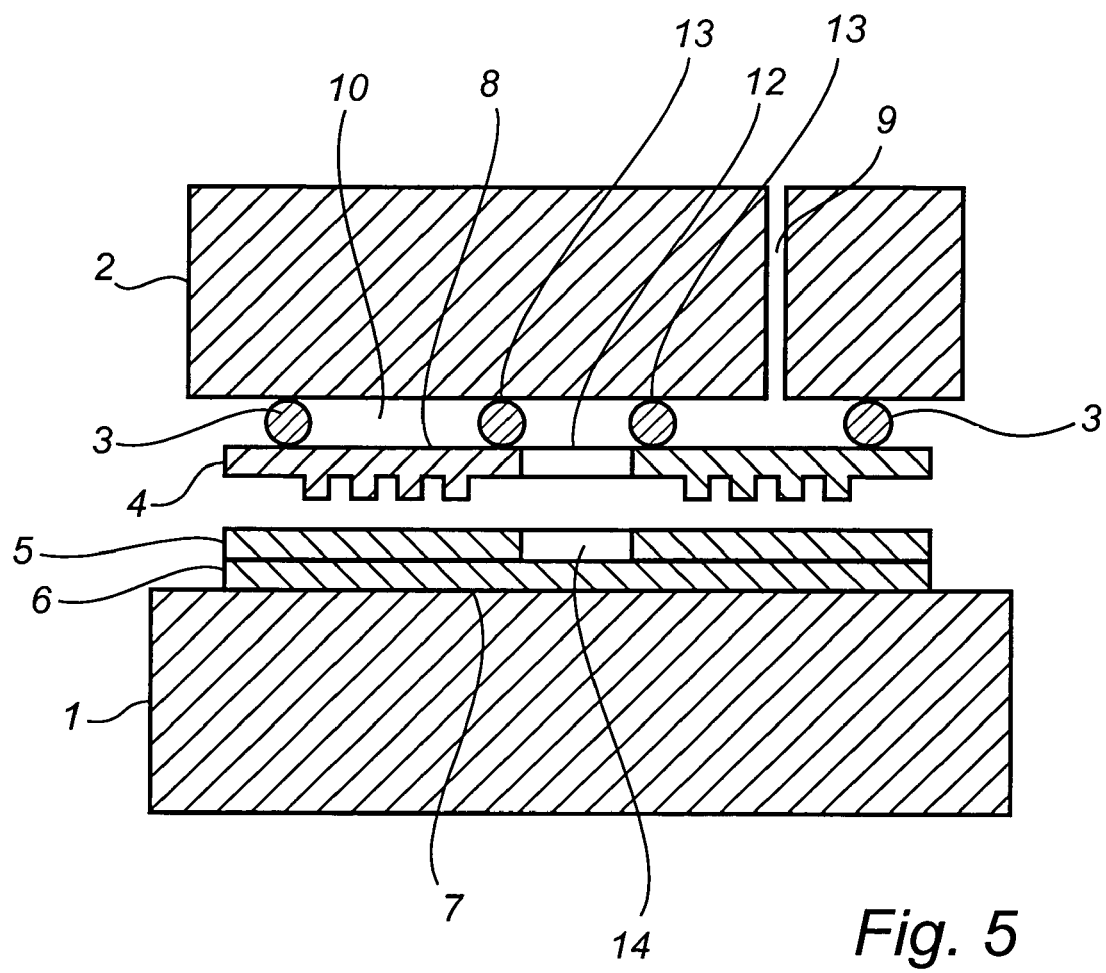
FIG. 5 is a schematic cross sectional view of a third embodiment of the invention.

FIG. 5 is a schematic cross sectional view of a third embodiment of the invention, wherein multiple, in this case two sealing gaskets 3, 13 are arranged between the template and the surface of the second support member 2. This embodiment is particularly suitable when the substrate and/or the template has a through hole, such as is the case with e.g. compact discs (CD) or digital versatile discs (DVD).

In this embodiment, the pressure cavity is defined by the surface of the support member 2, the template back surface and the two sealing gaskets 3, 13. Thus the pressure is provided only in the area where the relief pattern 15 is situated, and there is no pressure provided in the area where the hole is. This enables processing of templates and/or substrates having a through hole, without losing pressure. This may also prevent the template from being damaged by the contact with the edges of the holes.

Also in this embodiment, it is possible to provide a recess in the support member 2 surface, such that the recess coincides with the relief pattern and the sealing gaskets.

Figure 6:
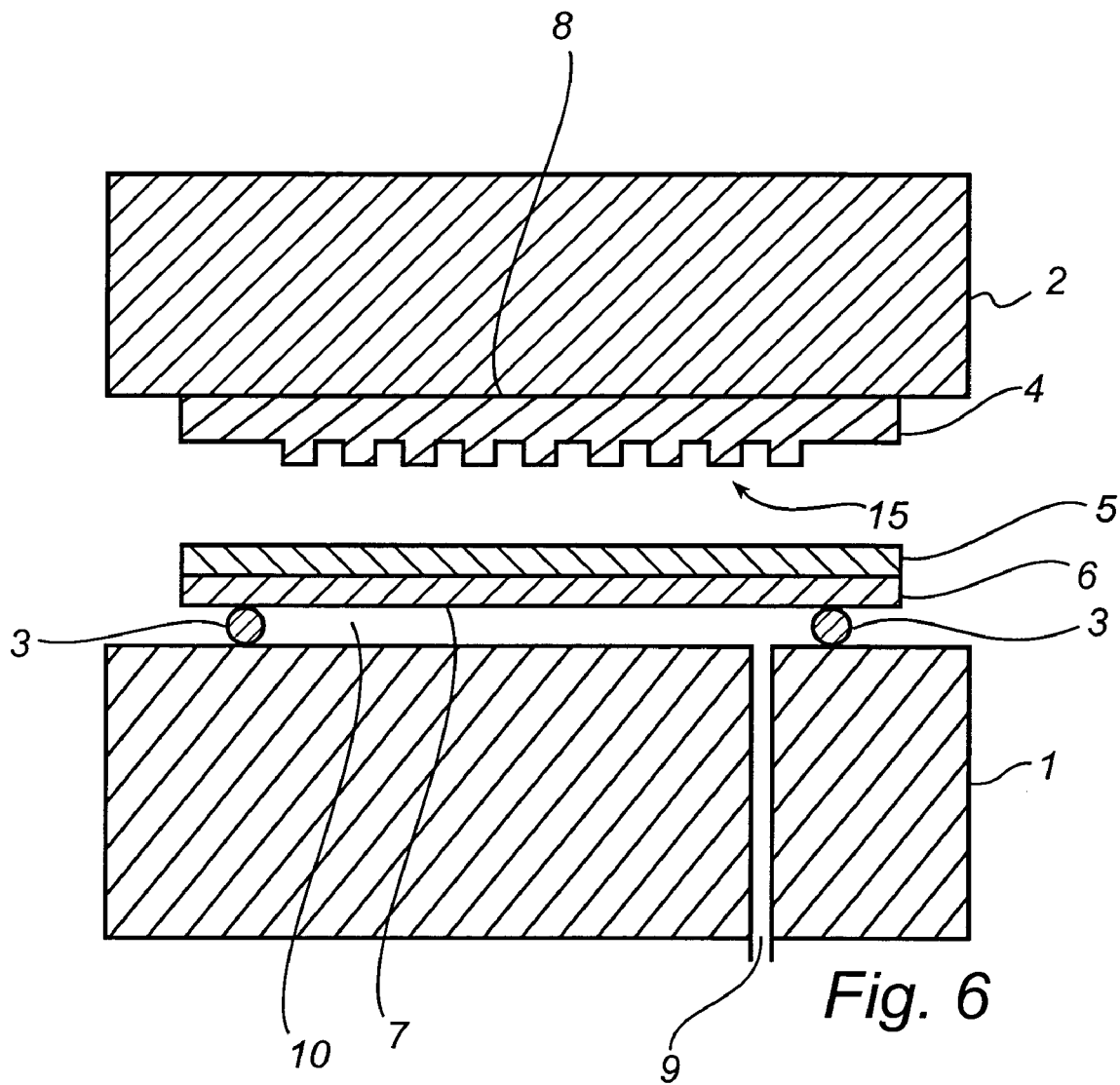
FIG. 6 is a schematic cross sectional view of a fourth embodiment of the invention.

FIG. 6 is a schematic cross sectional view of a fourth embodiment of the invention, wherein the cavity 10 is provided behind the substrate back surface 7 on the substrate support member 1. Thus, the cavity is defined by the surface of the support member 1, the sealing gasket 3 and the substrate back surface 7. In the embodiment of FIG. 6, the template is arranged on the support member 2. This embodiment may be advantageous in cases where the template is rigid and the substrate is flexible.

In a fifth embodiment, the support member 1 shown in FIG. 6 may be combined with the support member 2 shown in FIG. 1, so that both support members 1, 2 have pressure cavities. One or both support members according to the fifth embodiment may be provided with recesses such as that discussed in connection with FIG. 4 or additional sealing gaskets as discussed in connection with FIG. 5.

Figure 8:
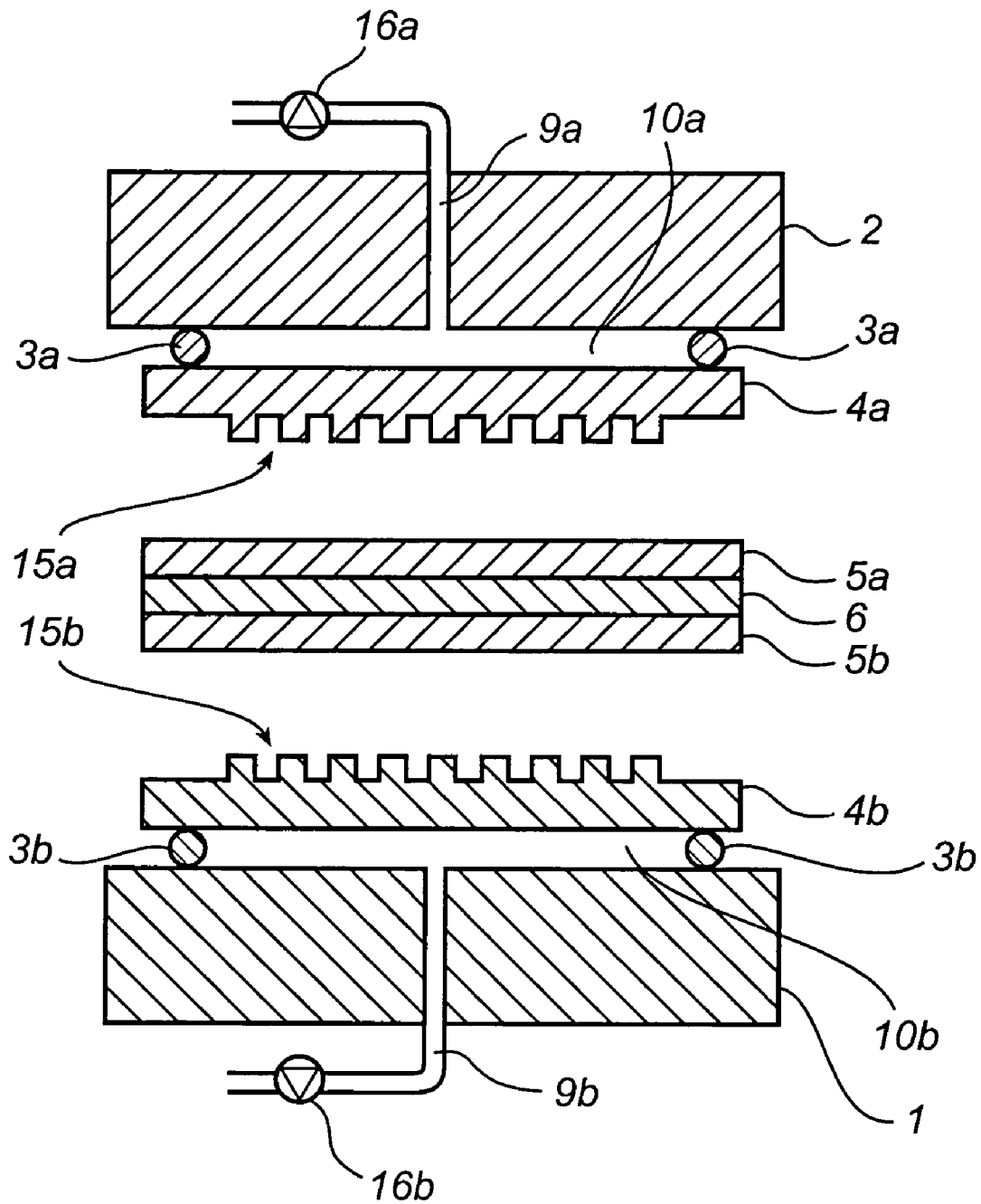
FIG. 8 is a schematic cross sectional view of A fifth embodiment of the invention

FIG. 8 illustrates yet another embodiment of the invention, wherein the apparatus is adapted for printing double sided substrates. with the embodiment of FIG. 8, a substrate 6 having first and second moldable surfaces 5a, 5b may be printed in a single printing step.

The apparatus in FIG. 8 comprises first and second support members 1, 2, each being adapted for supporting a substrate 4b, 4a respectively. The substrates 4b, 4a are supported by sealing gaskets 3b, 3a in a manner similar to that described above. When the templates 4b, 4a are arranged in a printing position, the sealing gaskets 3b, 3a, together with the support members 1, 2, define pressure cavities l0b, 10b ,10a respectively. Similar to the embodiments described above, the pressure in the pressure cavities 10b, 10a may be regulated by means of pressure medium channels 9b, 9a, respectively, wherein the gas flow is regulated by valves 16b, 16a.

The embodiment of FIG. 8 may have a plurality of applications, such as printing double-sided circuit boards or double-sided CD-ROMs or DVDs.

The pressure medium channel 9 in any of the embodiments may be connected to any suitable gas pressure generator. Inert gases are preferred as pressure medium, in order to reduce the risk of explosion. A typical pressure level when activating the pressure cavity 10 may be 40–100 bar.

It is also possible to connect the pressure medium channel 9 to a vacuum generator in order to generate a vacuum in the pressure cavity 10. This may be advantageous in case the template 4 and/or the substrate 6 is to be lifted in connection with e.g. their insertion, alignment or removal. In one embodiment of the invention, the partial vacuum is enough to lift the substrate or the template to which it is applied, but not so large as to deform the substrate or template so much as to provide contact between the surface of the support member and the substrate or template. Hence, the support member and the substrate or template remain entirely spaced apart while the at least partial vacuum is applied, i.e. there is no contact at any time between the support member and the substrate or template.

Thus, the static gas pressure may assume at least two states: a first state, where the cavity is deactivated, and a second state where the cavity is activated for pressing the template and the substrate against each other. In the first state, the gas pressure inside the cavity may be essentially equal to that of the surrounding environment. Alternatively, in the first state, the pressure in the cavity may be sufficiently lower than that of the surrounding environment, so as to provide the necessary lifting force so that the template or substrate received on the support member may be lifted Hence, the pressure may, but does not have to, be as low as 0.

In the second state, the pressure may be substantially higher than that of the first state and typically also higher than in the surrounding environment. The pressure in the second state should be sufficiently high so as to create the static pressure necessary for transferring the relief pattern of the template onto the moldable film of the substrate.

The pressure medium channel 9 may be provided with valves that are arranged to be closed rapidly in case a leakage should occur. Furthermore, it may be advantageous to keep the channel volume at a minimum, in order to further minimize the risk of explosion.

The entrance of the pressure medium channel into the cavity may be provided with diffusing means for diffusing the gas stream from the pressure medium channel so as to not create any pressure peaks on the back surface of the template or substrate.

The template and/or the substrate may require precise alignment in order for the lithography process to be accurate. To this end, the template and/or the substrate may be provided with means for alignment.

The template and substrate may be produced according to any known process and from any known material of combination of materials that are suitable for this purpose.

The sealing gasket may be produced from any known material that is suitable for the purpose.

In the embodiments shown, the support members 1, 2 as well as the template 4 and the substrate 6 have a generally circular form, but it is realized that they may have an desired shape.

Figure 7:
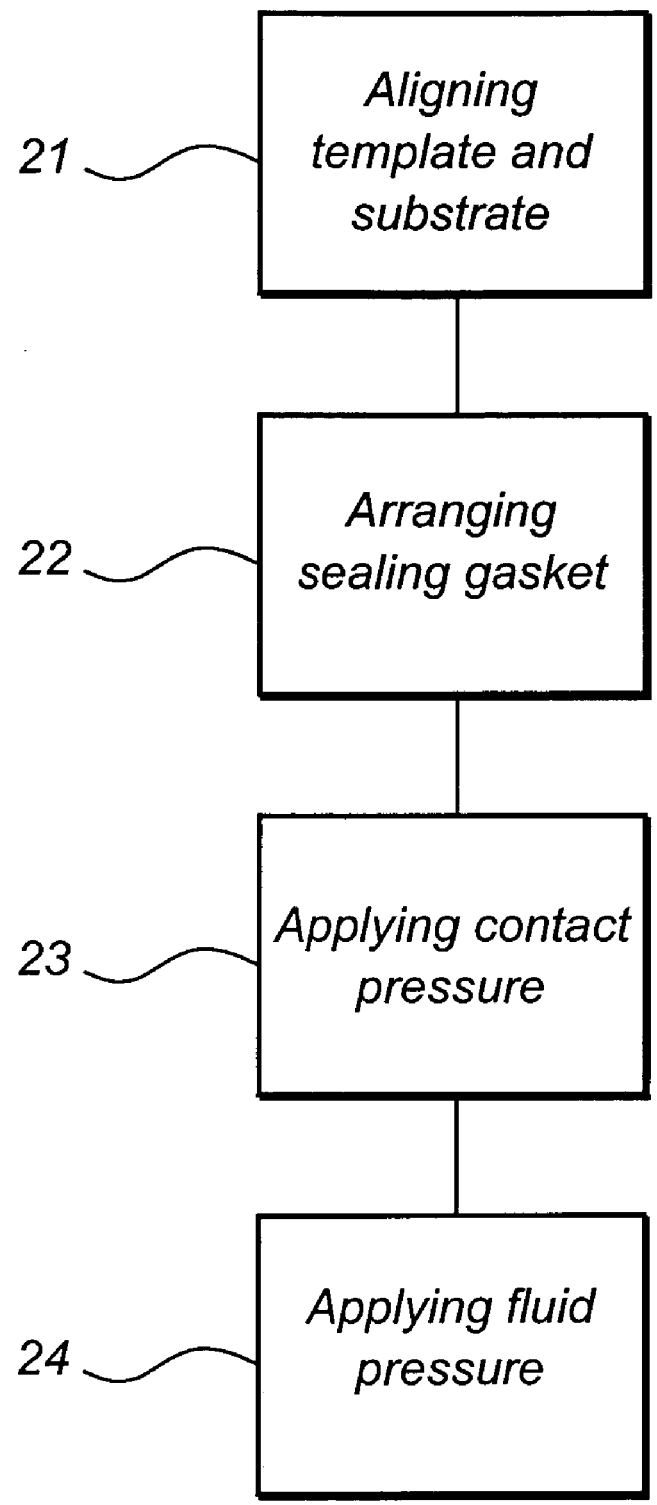
FIG. 7 is a flowchart of the method according to the invention.

FIG. 7 is a flowchart of the method according to the invention.

In a first step 21, the template 4 and the substrate 6 are aligned on their respective support members 2, 1. The template may be aligned with a recess 11 in the body of the support member 2

In a second step 22, a sealing gasket 3 is arranged between the template 4 and the second support member 2, so that a pressure cavity 10 is defined by the template, the support member and the sealing gasket. The first 21 and second 22 steps may be performed in a single step or in reverse order.

In a third, optional step 23, a contact pressure is applied so as to enable a pressure to be built up inside the pressure cavity 10. The step 23 could be integrated with e.g. step 21 or step 22.

In a fourth step, a static fluid pressure is applied to the cavity 10 by means of a pressure medium channel 9 It is also possible to increase the contact pressure successively applied in step 23 while the fluid pressure is being built up, and thus to adapt the contact pressure to the fluid pressure.

The invention claimed is:

1. An imprint process, comprising the steps of:
   aligning a substrate, supported on a first support member, with a template, supported on a second support member,
   said substrate having at least one essentially plane surface provided with a moldable film,
   said template having at least one essentially plane surface provided with a relief pattern, and
   said relief pattern facing said moldable film;
   arranging a first sealing gasket between said template and said second support member, such that a pressure cavity is defined by said second support member, said template and said first sealing gasket; and
   applying a static gas pressure to said pressure cavity, in order to press said template and said substrate together, so as to transfer the relief pattern of said template onto said moldable film,
   wherein said static gas pressure is held at a pressure higher than that of the surrounding environment for a time sufficient to transfer the relief pattern of said template onto said moldable film.

2. The process as claimed in claim 1, wherein the step of aligning said substrate and said template comprises aligning said template with a recess in a surface of said second support member, said recess being adapted for providing said static gas pressure on said back surface of said template.

3. The process as claimed in claim 1, wherein the static gas pressure is maintained by a contact pressure in the contact surface between said first sealing gasket and said template, said contact pressure being achieved by pressing together said second support member and said first support member.

4. The process as claimed in claim 1, further comprising the step of arranging a second sealing gasket between said template and said second support member, said second sealing gasket encircling a second surface area of the second support member.

5. The process as claimed in claim 1, further comprising the step of applying an at least partial vacuum to said pressure cavity, said at least partial vacuum being sufficient to retain said template when the second support member is spaced apart from said first support member.

6. The process as claimed in claim 5, wherein said second support member and said template remain spaced apart throughout the step of applying said at least partial vacuum to said pressure cavity.

7. An imprint process, comprising the steps of:
   aligning a substrate, support on a first support member, with a template, supported on a second support member,
   said substrate having at least one essentially place surface provided with a moldable film,
   said template having at least one essentially plane surface provided with a relief pattern,
   said relief pattern facing said moldable film;
   arranging a first sealing gasket between said substrate and said first support member, such that a pressure cavity is defined by said first support member, said substrate and said first sealing gasket, and
   applying a static gas pressure to said pressure cavity, in order to press said template and said substrate together, so as to transfer the relief pattern of said template onto said moldable film,
   wherein said static gas pressure is held at a pressure higher than that of the surrounding environment for a time sufficient to transfer the relief pattern of said template onto said moldable film.

8. The process as claimed in claim 7, wherein the step of aligning said template and said substrate comprises aligning said substrate with a recess in a surface of said first support member, said recess being adapted for providing said static gas pressure on said back surface of said substrate.

9. The process as claimed in claim 7, wherein the static gas pressure is maintained by a contact pressure in the contact surface between said first sealing gasket and said substrate, said contact pressure being achieved by pressing together said first support member and said second support member.

10. The process as claimed in claim 7, further comprising the step of arranging a second sealing gasket between said substrate and said first support member, said second sealing gasket encircling a second surface area of the first support member.

11. The process as claimed in claim 7, further comprising the step of applying an at least partial vacuum to said pressure cavity, said at least partial vacuum being sufficient to retain said substrate when the first support member is spaced apart from said second support member.

12. The process as claimed in claim 11, wherein said first support member and said substrate remain spaced apart throughout the step of applying said at least partial vacuum to said pressure cavity.

13. An imprint process, comprising the steps of:
aligning a substrate, with a first and a second template,
said substrate having first and second essentially plane surfaces, each surface being provided with a respective moldable film,
said first and second templates each having at least one essentially plane surface, which is provided with a respective relief pattern, and
each relief pattern one of said moldable films;
said first and second templates being supported on first and second support members respectively;
arranging a respective sealing gasket between each of said first and second templates and said respective support member, such that a first and a second pressure cavity is defined by said respective support member, said respective template and said respective sealing gasket; and
applying a static gas pressure to said pressure cavity, in order to press said template and said substrate together, so as to transfer the relief pattern of said template onto said moldable film,
wherein said static gas pressure is held at a pressure higher than that of the surrounding environment for a time sufficient to transfer the relief pattern of said template onto said moldable film.

14. The process as claimed in claim 13, further comprising the step of arranging said first and second templates on opposite sides of said substrate.

15. A process of claim 1, wherein the gas used to provide a static gas pressure is inert.

16. A process of claim 1, wherein said static gas pressure assumes at least two states:
a first state, wherein the static gas pressure within said pressure cavity is essentially equal to or less than a gas pressure of a surrounding environment, and
a second state, wherein the static gas pressure within said pressure cavity is substantially higher than in said first state.

17. A process of claim 16, wherein an average distance between a back surface of said template and said surface area of said second support member facing the first support member in said first state ranges from 0.01 to 4 millimeters.

18. A process of claim 17, wherein an average distance between a back surface of said template and said surface area of said second support member facing the first support member in said first state ranges from 0.3 to 1 millimeters.

19. A process of claim 18, wherein an average distance between a back surface of said template and said surface area of said second support member facing the first support member in said first state ranges from 0.4 to 1.6 millimeters.

20. A process of claim 1, wherein the surface area of said second support member on the surface supporting the template is provided with a recess extending over at least a part of the surface area.

21. A process of claim 4, wherein said pressure cavity is defined by the surface area of said second support member on the surface supporting the template, the first sealing gasket encircling a first surface area, the second sealing gasket encircling a second surface area, and said template.

22. A process of claim 21, wherein said pressure cavity is defined by a surface area that is located outside said second sealing gasket and inside said first sealing gasket.

23. A process of claim 21, wherein said second sealing gasket is arranged concentrically with said first sealing gasket.

24. A process of claim 7, wherein the gas used to provide a static gas pressure is inert.

25. A process of claim 7, wherein said static gas pressure assumes at least two states:
a first state, wherein the static gas pressure within said pressure cavity is essentially equal to or less than a gas pressure of a surrounding environment, and
a second state, wherein the static gas pressure within said pressure cavity is substantially higher than in said first state.

26. A process of claim 25, wherein an average distance between a back surface of said substrate and said surface area of said first support member facing the second support member in said first state ranges from 0.01 to 4 millimeters.

27. A process of claim 26, wherein an average distance between a back surface of said substrate and said surface area of said first support member facing the second support member in said first state ranges from 0.3 to 1 millimeters.

28. A process of claim 27, wherein an average distance between a back surface of said substrate and said surface area of said first support member facing the second support member in said first state ranges from 0.4 to 1.6 millimeters.

29. A process of claim 7, wherein the surface area of said first support member on the surface supporting the substrate is provided with a recess extending over at least a part of the surface area.

30. A process of claim 10, wherein said pressure cavity is defined by the surface area of said first support member on the surface supporting the substrate, the first sealing gasket encircling a first surface area, the second sealing gasket encircling a second surface area, and said template.

31. A process of claim 30, wherein said pressure cavity is defined by a surface area that is located outside said second sealing gasket and inside said first sealing gasket.

32. A process of claim 30, wherein said second sealing gasket is arranged concentrically with said first sealing gasket.

33. A process of claim 1, wherein said first sealing gasket is housed in a groove.

34. A process of claim 7, wherein said first sealing gasket is housed in a groove.

35. A process of claim 4, wherein said second sealing gasket is housed in a groove.

36. A process of claim 10, wherein said second sealing gasket is housed in a groove.

37. A process of claim 1, wherein said pressure in said pressure cavity is controlled via a pressure medium channel.

38. A process of claim 37, wherein said pressure medium channel has a valve used to control the flow in the pressure medium channel.

39. A process of claim 38, wherein said valve limits the flow of the pressure medium if a rapid change in pressure occurs.

40. A process of claim 37, wherein the entrance of said pressure medium channel has a diffusing means.

41. A process of claim 1, further including a pressure sensor in said pressure cavity and/or in said pressure medium channel.

42. A process of claim 7, wherein said pressure in said pressure cavity is controlled via a pressure medium channel.

43. A process of claim 42, wherein said pressure medium channel has a valve used to control the flow in the pressure medium channel.

44. A process of claim 43, wherein said valve limits the flow of the pressure medium if a rapid change in pressure occurs.

45. A process of claim 41, wherein the entrance of said pressure medium channel has a diffusing means.

46. A process of claim 7, further including a pressure sensor in said pressure cavity and/or in said pressure medium channel.

47. A process of claim 20, wherein said recess covers a surface area equal to the area provided by the relief pattern.

48. A process of claim 20, wherein said recess is provided with groves.

49. A process of claim 29, wherein said recess covers a surface area equal to the area provided by the relief pattern.

50. A process of claim 29, wherein said recess is provided with groves.

* * * * *